(12) United States Patent
Mobley

(10) Patent No.: US 6,278,646 B1
(45) Date of Patent: *Aug. 21, 2001

(54) MULTI-ARRAY MEMORY DEVICE, AND ASSOCIATED METHOD, HAVING SHARED DECODER CIRCUITRY

(75) Inventor: Kenneth J. Mobley, Colorado Springs, CO (US)

(73) Assignee: Enhanced Memory Systems, Inc., Colorado Springs, CO (US)

(*) Notice: Subject to any disclaimer, the term of this patent is extended or adjusted under 35 U.S.C. 154(b) by 0 days.

This patent is subject to a terminal disclaimer.

(21) Appl. No.: 09/533,923

(22) Filed: Mar. 23, 2000

Related U.S. Application Data

(63) Continuation-in-part of application No. 09/111,822, filed on Jul. 8, 1998, now Pat. No. 6,064,620.

(51) Int. Cl.[7] .................................................. G11C 8/00
(52) U.S. Cl. .............................. 365/230.03; 365/230.06; 365/230.08; 365/189.12; 365/203; 365/205
(58) Field of Search ..................... 365/230.03, 230.06, 365/230.08, 189.12, 203, 205

(56) References Cited

U.S. PATENT DOCUMENTS

| 5,301,162 | * | 4/1994 | Shimizu ........................ 365/230.03 |
| 5,349,552 | | 9/1994 | Ampaglione ......................... 365/51 |
| 5,687,125 | | 11/1997 | Kikuchi .............................. 365/200 |
| 5,883,848 | | 3/1999 | Kim et al. ...................... 365/230.03 |
| 6,097,623 | * | 8/2000 | Sakata et al. ...................... 365/145 |
| 6,128,244 | * | 10/2000 | Thompson et al. ............. 365/230.03 |

* cited by examiner

Primary Examiner—David Nelms
Assistant Examiner—Connie C. Yoha
(74) Attorney, Agent, or Firm—Peter J. Meza; Stuart T. Langley; Hogan & Hartson, LLP

(57) ABSTRACT

A memory device, and an associated method, contain at least two memory arrays and a single decoder shared by the memory arrays. When data is to be accessed from selected memory locations of one of the memory arrays, the non-selected memory array is inactivated by precharging the bit lines of the array to a common voltage with the data input and/or output buses for that array, thereby allowing the decoder to select the inactive array without harm, and thereby preventing the need for additional decoder circuitry to discriminate between the arrays. The array containing the selected memory locations remains active, thereby permitting accessing of the memory locations therein.

6 Claims, 4 Drawing Sheets

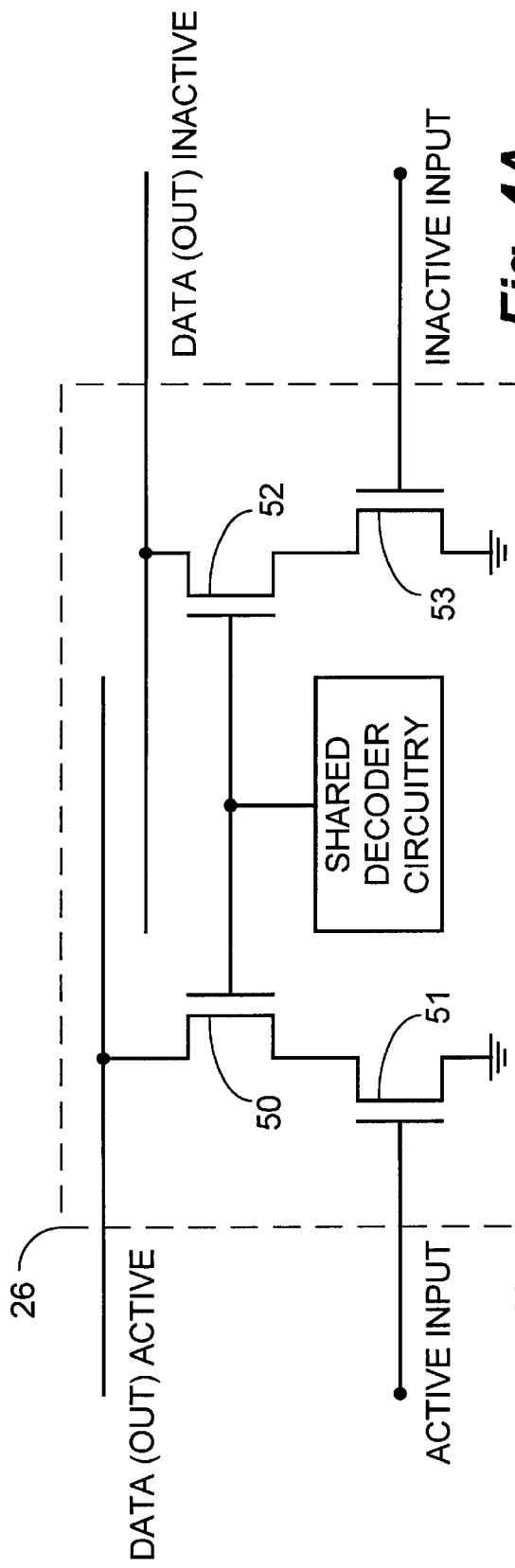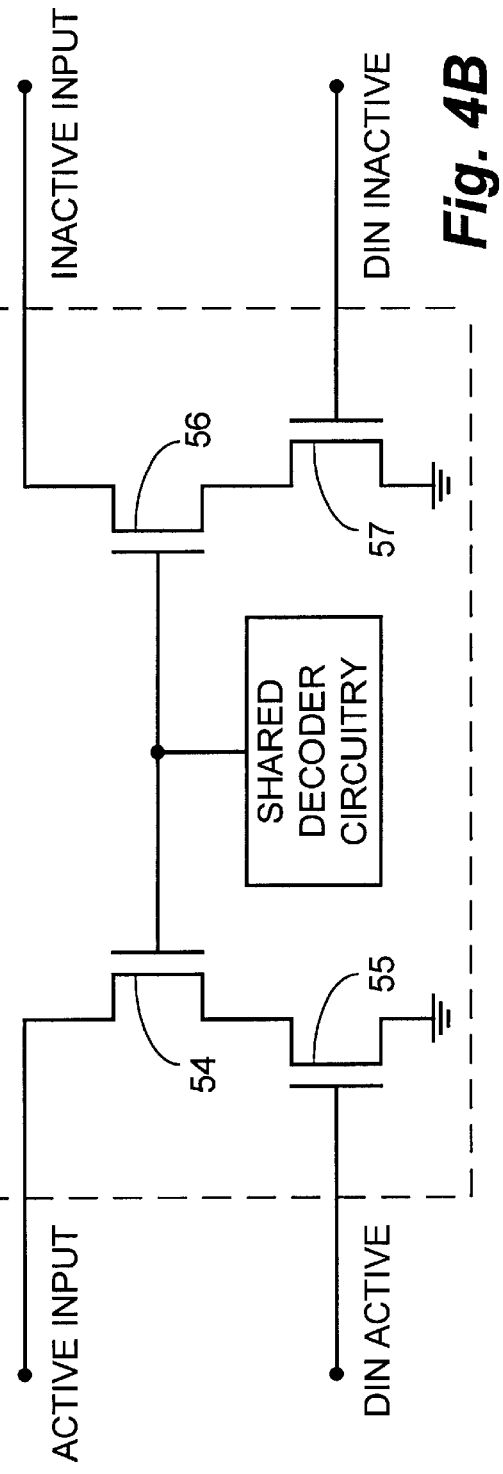

MULTI-ARRAY MEMORY DEVICE, AND ASSOCIATED METHOD, HAVING SHARED DECODER CIRCUITRY

CROSS REFERENCE TO RELATED PATENT APPLICATIONS

The present application is a continuation-in-part of U.S. patent application Ser. No. 09/111,822 filed Jul. 8, 1998 for "Multi-Array Memory Device, and Associated Method now U.S. Pat. No. 6,064,620, Having Shared Decoder Circuitry", assigned to Enhanced Memory Systems, Inc., Colorado Springs, Colo., assignee of the present invention, the disclosure of which is herein specifically incorporated by this reference.

BACKGROUND OF THE INVENTION

The present invention relates generally to a memory device, such as a DRAM (dynamic random access memory) or enhanced dynamic random access memory (EDRAM® is a registered trademark of Enhanced Memory Systems, Inc.) having memory locations forming memory arrays. More particularly, the present invention relates to a multi-array memory device, and an associated method, by which decoder circuitry of the memory device is shared by more than one memory array.

In accordance with the present invention, because the bit decoder circuitry is shared by more than one memory array, separate bit decoders, conventionally associated with each memory array are not required. Thereby, the circuit area required to implement memory device is reduced relative to conventional multi-array memory devices. Through operation of an embodiment of the present invention, when memory locations of a selected memory array of the memory device are to be accessed, such as to perform read or write operations, the selected memory array becomes or remains active. All other memory arrays are driven to be inactive while biasing the write or input/output buses of the non-selected memory arrays to an inactive-array, bit-line, precharge voltage. In such manner, extra control lines are not required to activate, or inactivate, particular ones of the memory arrays.

The use of digital processing circuitry, and apparatus including such circuitry, to perform a wide range of functions is pervasive in modem society. Repetitive functions carried out by such circuitry can be performed at rates much more quickly than the corresponding functions performed manually. Functions can be performed, for instance, to process large amounts of data at a rapid rate. Such processing of data sometimes includes reading data from, or writing data to, memory devices.

A digital computer system, for example, includes a computer main memory which provides storage locations from which data can be read or to which data can be written. A computer main memory is typically formed of a plurality of memory devices which together form the main memory. The computer main memory, for instance, is sometimes formed of a number of asynchronous DRAM (dynamic random access memory) integrated circuits. Some conventional computer memories includes faster, SRAM (static random access memory) integrated circuits. SRAM devices permit quicker access to the memory locations thereof by making a high speed, locally-accessed copy of the memory available to the CPU (central processing unit) of the digital computer system.

Some computer systems include a computer main memory formed of EDRAM (enhanced dynamic random access memory; EDRAM™ is a trademark of Enhanced Memory Systems, Inc., Colorado Springs, Colo., assignee of the present invention). An EDRAM integrated circuit forms a memory device in which an static register (or SRAM row) component and a DRAM component are integrated onto a single integrated circuit chip. The advantages of a the improved access speeds of an SRAM device is provided to permit the CPU of the computer system to access the memory locations thereof at high access rates.

Such aforementioned memory devices are formed of memory locations which form memory arrays. The memory locations of the memory arrays are identified by memory addresses. When a memory location of a memory array is to be accessed, the address of the memory location is provided to decoder circuitry which decodes the address signals applied thereto to permit the access to the appropriate memory locations. Conventionally, separate decoder circuitry is associated with each memory array of a memory device. When memory locations of a memory array are to be accessed, address signals applied to the decoder circuitry permit the appropriate memory locations of the memory array associated with the particular decoder circuitry to be accessed.

A significant design goal in the design and implementation of an integrated circuit is the minimization of the circuit area required to implement the circuit. Any manner by which to reduce the circuit area required to implement the circuit would facilitate the miniaturization of the circuit. The conventional use of separate decoder circuitry associated with each array of a multi-array memory device requires significant circuit area for its implementation.

A manner by which to address memory locations of any selected memory array of a multi-array memory device without requiring the memory device to include separate decoder circuitry associated with each memory array would advantageously permit the reduction in circuit area required to implement the memory device. While some existing techniques have been developed which permit sharing of decoder circuitry between more than one memory array, such existing techniques typically require extra decoder circuitry, as well as extra address or command lines, to effectuate the sharing of decoder circuitry.

It is in light of this background information related to memory devices that the significant improvements of the present invention have evolved.

SUMMARY OF THE INVENTION

The present invention, accordingly, advantageously provides a multi-array, memory device, and an associated method, having bit decoder circuitry shared by more than one memory array of the memory device.

A memory device constructed according to the teachings of an embodiment of the present invention reduces the circuit area required for the implementation of the memory device as separate bit decoder circuitry need not be associated with each memory array. A single bit decoder circuit is shared by more than one memory array without the need of additional decoder circuitry or additional control lines. By removing the redundancy of the separate decoder circuitry associated with each of the memory arrays, the circuit area required to implement the memory device is reduced.

During operation of an embodiment of the present invention, when memory locations of a selected memory array of a multi-array memory device are to be accessed, any selected memory arrays becomes active, while all other memory arrays remain inactive. By biasing the write or input/output buses of the non-selected memory arrays to the same voltage as the bit lines of the non-selected memory arrays, the memory locations of only the active memory array are accessed. Extra control lines and extra control circuitry are not required.

In one implementation, a DRAM/SRAM row device containing multiple-writeable, memory arrays is provided. A single decoder is shared between the arrays. When write operations are to be performed upon selected memory locations of a particular one of the memory arrays, the selected memory array remains, or becomes, active while all non-selected memory arrays are caused to become inactive. The write buses of the non-selected memory arrays are set to the bit-line precharge voltage. Thereby, coupling of the buses to the bit lines through the action of the shared decoder, is not harmful, while the selected memory locations are accessed in the active array and the write operations are performed to write data to such selected memory locations.

In another implementation, a DRAM containing multiple-writeable, memory arrays is provided. A single decoder is shared between the arrays. When write operations are to be performed upon selected memory locations of a particular memory array, the selected memory array remains, or becomes, active while all non-selected memory arrays are caused to become inactive. The write buses of the non-selected memory arrays are set to the bit-line precharge voltage. Thereby, coupling of the buses to the bit lines through the action of the shared decoder is not harmful, while the selected memory locations are accessed in the active array and the write operations are performed to write data to such selected memory locations.

In these and other aspects, therefore, a memory device, and an associated method, for storing data therein is provided. The memory device includes a first memory array having a first plurality of memory locations and at least a second memory array having at least a second plurality of memory locations. A decoder is coupled to the first memory array and to the at least second memory array. The decoder is coupled also to receive indications of accessed requests to access selected memory locations of the first and at least second plurality of memory locations. The decoder circuitry selectively accesses the memory locations identified by the indications of the access requests. Biasing circuitry is coupled to the first memory array and to the at least second memory array. The biasing circuitry selectively biases the bit lines of all but a selected at least one memory array of the first memory array and the at least second memory array. The at least one selected memory array contains the selected memory locations identified in the indications of the accessed requests received by the decoder. The at least one selected memory array remains, or becomes active, and the memory locations thereof accessible. Each of the first memory array and the at least the second memory array biased by the biasing circuitry become inactive and the memory locations thereof inaccessible. The write or I/O buses of the unselected arrays are biased by similar biasing circuitry to a similar voltage so that the selection of the inactive arrays by the shared decoder is not effective or harmful.

A more complete appreciation of the present invention and to the scope thereof can be obtained from the accompanying drawings which are briefly summarized below, the following detailed description of the presently-preferred embodiments of the invention, and the appended claims.

BRIEF DESCRIPTION OF THE DRAWINGS

FIG. 4A illustrates an alternative embodiment of the single shared bit decoder of FIGS. 1 and 2.

FIG. 4B illustrates an additional alternative embodiment of the single shared bit decoder of FIGS. 1 and 2.

DETAILED DESCRIPTION

Figure 1:
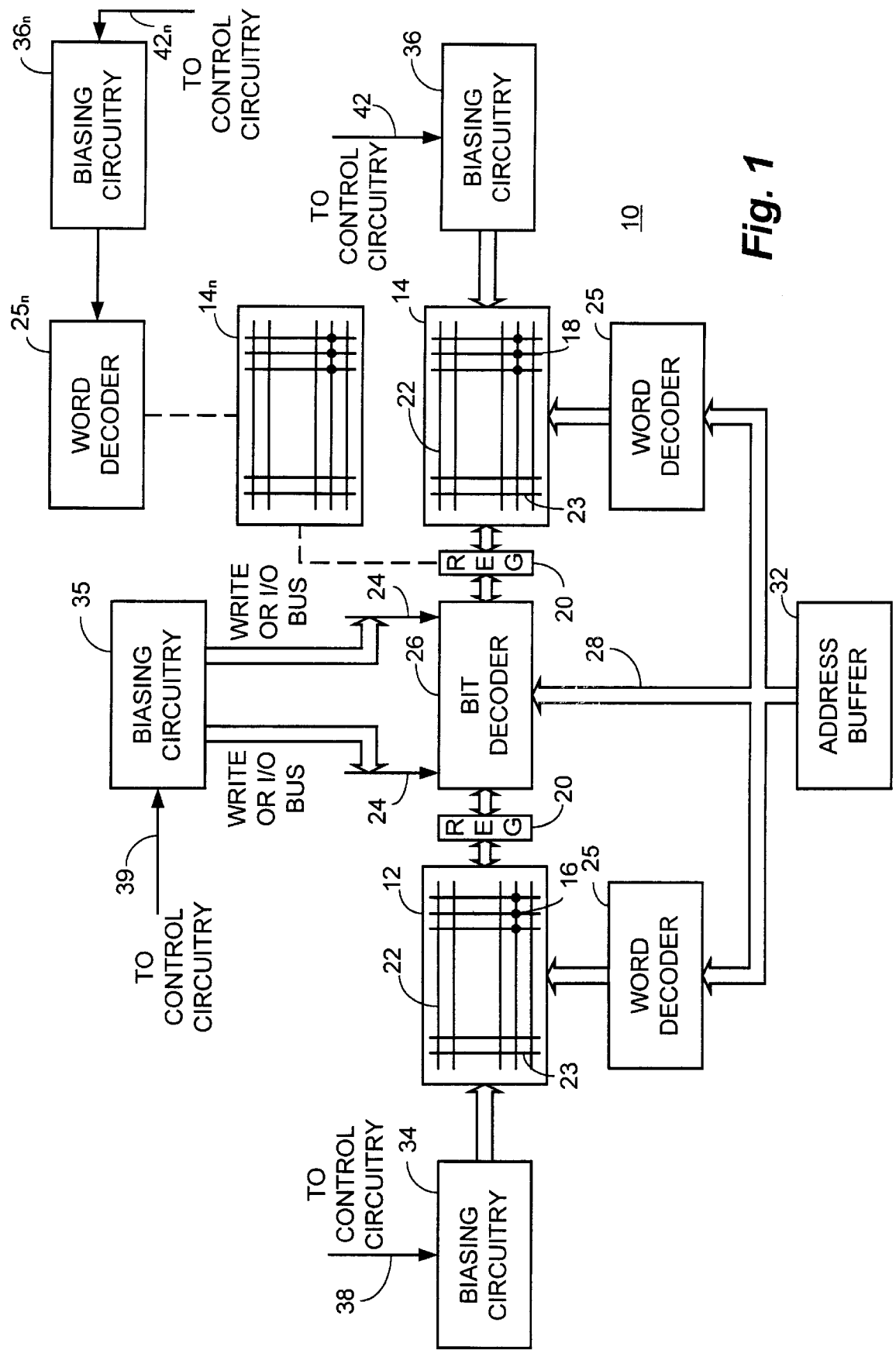
FIG. 1 illustrates a functional block diagram of a memory device of an embodiment of the present invention.

Referring first to FIG. 1, a portion of a memory device, shown generally at 10, of an embodiment of the present invention is shown. In the exemplary embodiment, the memory device 10 forms a two-array, enhanced dynamic random access memory integrated circuit. In other embodiments, the memory device is formed of other types of memory devices.

Here, the memory device 10 includes a first memory array 12 and a second memory array 14. The memory arrays 12 and 14 are conventional in nature and include an array of memory locations formed of RAM (random access memory) cells, of which three cells 16 are represented in the Figure to form portions of the memory array 12. Similarly, three memory cells 18 are indicted in the Figure, exemplary of the memory cells of the memory array 14. Memory arrays 12 and 14 each may include a static register 20 (comprising a "read" and/or "write" register for non-volatile retention of data to be read from and/or written to the memory arrays 12 and 14 in a static RAM ("SRAM") or other form of memory technology cache, register, latch or similar form of high access speed data storage) and a DRAM main memory portion, integrated on a common integrated circuit chip. In conventional manner, the cells 16 and 18 are each formed to be coupled to bit lines 22 and to word lines 23.

The lines 22 and 23 of the arrays 12 and 14 are coupled to decoders 25 and 26 such that the decoder 26 is shared by both of the memory arrays. And, the decoders 25 and 26 are coupled to an address bus 28 to receive addresses identifying selected ones of the memory locations, such as the cells 16 or 18 of the arrays 12 and 14, respectively. The addresses are, for example, externally-generated and stored in the address buffer 32, thereafter to be transported by way of the address bus 28 to the decoders 25 and 26.

The biasing circuitry 34, 35 and 36, are selectably operable to bias the bit lines 22 and the input or I/O buses 24 of the decoder 26 to which the respective biasing circuitry 34, 35, and 36 is coupled. The biasing circuitry is controlled by control circuitry (not shown) by way of the lines 38, 39, and 42, respectively.

When data is to be written to selected memory locations of one or the other of the memory arrays 12 or 14, the address of the memory locations to be accessed is generated and transported upon the address bus 28 to the decoder 26. Also, the biasing circuitry 34, 35 and 36, as appropriate, biases the bit lines 22 and bus lines 24 of the memory array 12 and 14 not containing the memory locations to which data is to be written. That is to say, the memory array containing the memory locations to which data is to be written forms a selected memory array, and the remaining memory array, forms a non-selected array. The non-selected array is caused to be biased with the biasing circuitry associated therewith such that all bit lines of the non-selected memory array are charged to a voltage level corresponding to the voltage level of the data input or I/O buses of the decoder so that a voltage differential is not maintained therebetween. Without a voltage differential, the non-selected bit lines and data buses form a common nodal potential. The selected memory array remains operable in conventional manner for the memory locations thereof to be accessible to write data thereto or read data therefrom. Because the biasing circuitry 34, 35, and 36 form portions of a conventional enhanced dynamic random access memory device, or other memory device, no additional circuitry is required to inactivate non-selected memory arrays. And, because separate decoder circuitry need not be associated with each memory array, the circuit area required to implement the memory device 10 is reduced relative to conventional implementations, and without the need to provide additional decoder circuitry to inactivate one or the other of the memory arrays.

In embodiments in which the memory device 10 includes greater numbers of memory arrays (as shown by the dashed lines in FIG. 1 showing memory array $14_n$, word decoder $25_n$, biasing circuitry $36_n$ and control line $42_n$), all of the non-selected memory arrays are biased, and only the selected memory arrays contain memory locations which are accessible through operation of the decoder 26.

Figure 2:
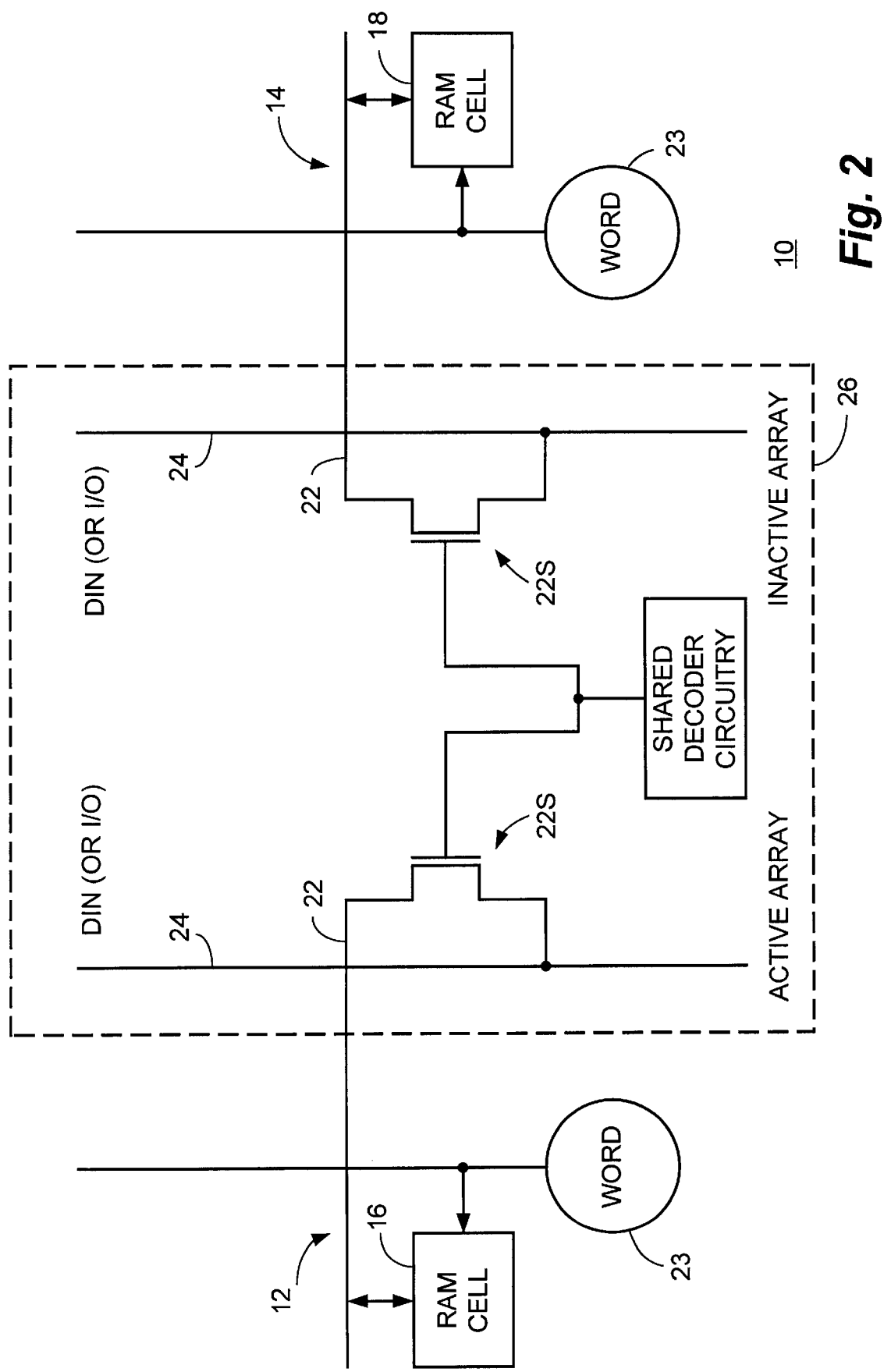
FIG. 2 illustrates a partial functional block diagram, partial circuit diagram of a portion of the memory device shown in FIG. 1.

FIG. 2 illustrates a portion of the memory device 10. Portions of the memory arrays 12 and 14 are again also shown. Here, a single memory cell 16, is illustrated at the memory array 12. The cell 16 is coupled to a word line 23 and to a bit line 22. Analogously, a single memory cell 18, is illustrated at the memory array 14. The cell 18 is coupled to a word line 23 and to a bit line 22. While not separately shown, plurality of other word lines and bit lines, and associated memory cells, form portions of the memory arrays 12 and 14.

The decoder 26 is shown to be coupled to the bit lines 22 of both of the memory arrays 12 and 14 to be shared therebetween.

In the exemplary illustration of the Figure, the memory array 12 forms the selected array while the memory array 14 is non-selected. The DIN (or I/O) lines 24 of the memory array 14 are driven to a voltage $V_{off}$. Driving DIN (or I/O) line 24 of the non-selected array turns off a switch 22S of the non-selected array, thereby to make the memory cells 18 of the memory array 14 inaccessible. The selected memory array, memory array 12, is operable in conventional manner to write or read data to or from the memory locations identified by the addresses applied to the decoder 26. Namely, appropriate ones of the word lines 23 are driven, and appropriate ones of the bit lines 22 are driven or sensed to write data to or read data from the selected ones of the cells 16 of the memory array 12.

Because unused data buses 24 are biased to the same voltage as their respective unused bit lines 22, the single decoder 26 is shared between the two memory arrays 12 and 14 without the need for additional control lines or control circuitry to activate or inactivate the non-selected memory array. Additional memory arrays can be coupled to the decoder 26 in similar fashion, thereby to share the single decoder 26 amongst more that two memory arrays.

Figure 3:
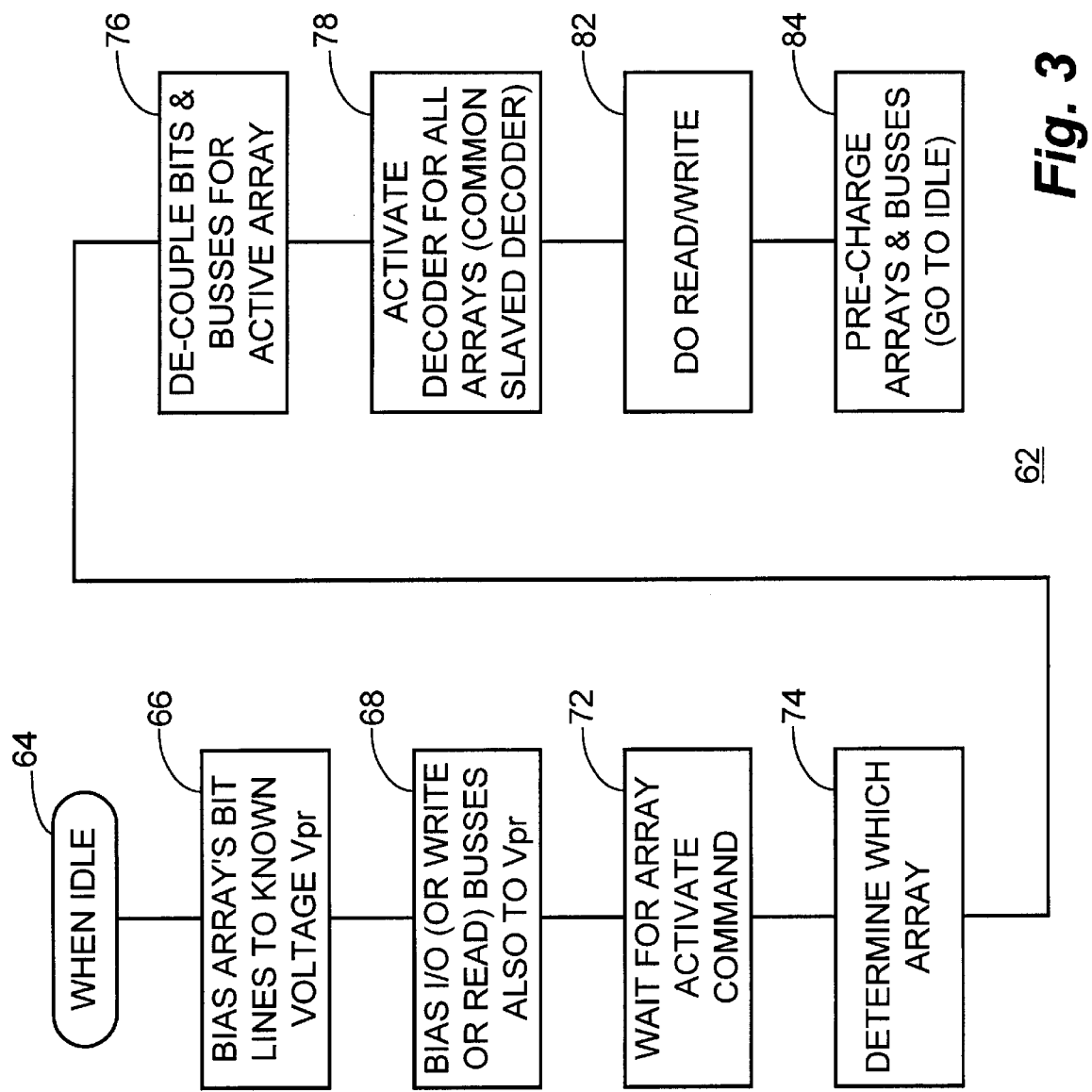
FIG. 3 illustrates a method flow diagram showing the method of operation of an embodiment of the present invention.

FIG. 3 illustrates a method, shown generally at 62, of an embodiment of the present invention. The method 62 provides a manner by which to access selected memory locations of a memory array of a multi-array memory device. The memory device includes a bit decoder which is coupled to bit lines of each memory array of the memory device. The bit decoder is utilized to access memory locations of at least a selected one of the memory arrays of the memory device.

First, and as indicated by the state 64, the memory device is initially in an idle state. Then, and as indicated by the block 66, the bit lines of the memory arrays are biased to a known voltage, $V_{PR}$. Input/output (or read or write) buses of the memory arrays are also biased, as indicated by the block 68, to the same voltage $V_{PR}$. Thereafter, and as indicated by the block 72, the bit lines and the input/output, or read or write, buses are maintained at the bias voltage while awaiting an array activate command. Once an array activate command is generated, a determination is made, as indicated by the block 74, as to which array, or arrays, of the multi-array memory device contains memory locations which are to be accessed.

Then, and as indicated by the block 76, the bit lines and input/output, or read or write, buses of the array, or arrays, determine at the block 76 to contain the selected memory locations become decoupled from the biasing circuitry used to bias all of the bit lines and buses of the active array or arrays. As indicated by the block 78, the common shared decoder is activated. The appropriate memory access operation, i.e., a read or write operation, is performed, as indicated by the block 82. Once the operation is completed, the bit lines and buses of the array, or arrays, are again precharged, as indicated by the block 84, and a return is made to the idle state 64.

With reference additionally now to FIG. 4A, an alternative embodiment of the single shared bit decoder 26 of FIGS. 1 and 2 is shown. The decoder 26 in this embodiment comprises similar shared decoder circuitry (or other "select" input from any decoder) to that illustrated in FIG. 2 in conjunction with two series coupled transistor pairs 50, 51 and 52, 53. The transistor pair 50, 51 is coupled between a data (out) active line and circuit ground with the gate terminal of transistor 50 being coupled to the shared decoder circuitry and the gate terminal of transistor 51 receiving an active input signal. In like manner, the transistor pair 52, 53 is coupled between a data (out) inactive line and circuit ground with the gate terminal of transistor 52 also being coupled to the shared decoder circuitry and the gate terminal of transistor 53 receiving an inactive input signal. In operation, when a logic level equivalent to circuit ground is placed on the data (out) inactive line, the terminal of transistor 52 connected to this line is then at the same potential as the terminal of transistor 53 coupled to circuit ground such that no input to either the gate of transistor 52 from the shared decoder circuitry or the gate terminal of transistor 53 coupled to the inactive input line will cause either of these devices to switch. The signals on the active and inactive inputs may come from a memory array, latch, cache, register or other memory element source.

With reference additionally now to FIG. 4B, an additional alternative embodiment of the single shared bit decoder 26 of FIGS. 1 and 2 is shown. The decoder 26 in this embodiment comprises similar shared decoder circuitry (or other "select" input from any decoder) to that illustrated in FIG. 2 in conjunction with two series coupled transistor pairs 54, 55 and 56, 57. The transistor pair 54, 55 is coupled between an active input line and circuit ground with the gate terminal of transistor 54 being coupled to the shared decoder circuitry and the gate terminal of transistor 55 receiving a DIN active signal. In like manner, the transistor pair 56, 57 is coupled between an inactive input line and circuit ground with the gate terminal of transistor 56 also being coupled to the shared decoder circuitry and the gate terminal of transistor 57 receiving a DIN inactive signal.

As previously noted with respect to the embodiment of FIG. 4A, the signals on the active and inactive inputs may come from a memory array, latch, cache, register or other memory element source. In operation, if the signal on the DIN inactive line to the gate of transistor 57 is at a level of substantially circuit ground, transistor 57 be in an "off" state thereby also allowing the shared decoder circuitry to be shared between active and inactive memory arrays, latches, caches, registers and other memory element sources in a similar manner.

Because only a single decoder is required to access memory locations of any selected one of a plurality of memory arrays, latches, caches, registers and other memory element sources to which the decoder is coupled, the circuit area required to implement the memory device is reduced relative to conventional devices. Such reduction in required circuit area to implement the memory device permits miniaturization of the memory device.

The previous descriptions are of preferred examples for implementing the invention, and the scope of the invention should not necessarily be limited by this description. The scope of the present invention is defined by the following claims.

What is claimed is:

1. A memory device comprising:

first and second memory banks, each of said memory banks having a corresponding word decoder associated therewith for accessing word lines in said memory banks;

a common bit decoder coupled to said first and second memory banks for accessing bit lines in said first and second memory banks; and biasing circuitry coupled to provide a bias signal to said common bit decoder, said biasing circuitry being further coupled to selectively provide said bias signal to said bit lines of either said first or second memory banks, said common bit decoder being operative with said corresponding word decoder to alternatively access memory locations in a one of said first or second memory banks to which said bias signal has not been supplied.

2. The memory device of claim 1 further comprising:

first and second row registers respectively interposed between said common bit decoder and said first and second memory banks for storing at least a portion of data to be read out of said memory banks.

3. The memory device of claim 1 further comprising:

first and second row registers respectively interposed between said common bit decoder an d said first and second memory banks for storing at least a portion of data to be written to said memory banks.

4. The memory device of claim 1 wherein said common bit decoder comprises:

first and second switching devices, said first and second switching devices each having a first terminal thereof coupled to receive said bias signal from said biasing circuitry and a second terminal thereof coupled to at least one of said bit lines in said first and second memory banks respectively, said first and second switching devices each having a control terminal thereof coupled to a shared decoder circuit, said common bit decoder being operative such that said memory locations in either of said first or second memory bank are not accessible when said bias signal is applied to both said first and second terminals of a corresponding one of said first and second switching devices.

5. The memory device of claim 1 wherein said common bit decoder comprises:

first and second pairs of series connected switching devices having a first terminal thereof coupled to at least one of said bit lines in said first and second memory banks respectively and a second terminal thereof coupled to a reference voltage level, said first and second pairs of series connected switching devices each having first and second control terminals thereof, said first control terminals of said first and second pairs of series connected switching devices being coupled to receive said bias signal and said second control terminals being coupled to a shared decoder circuit, said common bit decoder circuit being operative such that said memory locations in either of said first or second memory banks are not accessible when said bias signal corresponds to said reference voltage level and is applied to said second control terminal of a corresponding one of said first and second pairs of series connected switching devices.

6. The memory device of claim 1 wherein said common bit decoder comprises:

first and second pairs of series connected switching devices having a first terminal thereof coupled to receive said bias signal and a second terminal thereof coupled to a reference voltage level, said first and second pairs of series connected switching devices each having first and second control terminals thereof, said first control terminals of said first and second pairs of switching devices being coupled to receive either a data input active or inactive signal and said second control terminals being coupled to a shared decoder circuit, said common bit decoder being operative such that said memory locations in either of said first or second memory banks are not accessible when said data input inactive signal is applied to said first control terminal of a corresponding one of said first and second pairs of series connected switching devices.

* * * * *